(12) United States Patent
Park et al.

(10) Patent No.: US 7,795,678 B2
(45) Date of Patent: Sep. 14, 2010

(54) SEMICONDUCTOR DEVICE AND METHOD OF MANUFACTURING THE SAME

(75) Inventors: Jong-Man Park, Yongin-si (KR);
Satoru Yanada, Seoul (KR); Sang-Yeon Han, Suwon-si (KR); Jun-Bum Lee, Yongin-si (KR); Si-Ok Sohn, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 39 days.

(21) Appl. No.: 12/137,573

(22) Filed: Jun. 12, 2008

(65) Prior Publication Data
US 2008/0308863 A1    Dec. 18, 2008

(30) Foreign Application Priority Data
Jun. 12, 2007    (KR) .................... 10-2007-0057411

(51) Int. Cl.
*H01L 29/739*    (2006.01)
(52) U.S. Cl. .................. 257/347; 257/330; 257/332; 257/333; 257/334; 257/E29.197
(58) Field of Classification Search ................ 257/330, 257/332, 333, 334, E29.197, 347
See application file for complete search history.

(56) References Cited
U.S. PATENT DOCUMENTS
2006/0151837 A1*    7/2006  Chen et al. ............... 257/369

2007/0007571 A1*    1/2007  Lindsay et al. ............ 257/306

FOREIGN PATENT DOCUMENTS
KR        10-0495668        6/2005
KR    10-2006-0023679       3/2006
KR        10-0584776        5/2006

\* cited by examiner

Primary Examiner—Tan N Tran
(74) Attorney, Agent, or Firm—Volentine & Whitt, PLLC

(57) ABSTRACT

A semiconductor device includes a buried isolation pattern between an active pattern on which transistors are formed and a substrate. The active pattern has adjacent sections each extending longitudinally in a first direction. A field isolation pattern is interposed between the adjacent sections of the active pattern. The buried isolation pattern has sections spaced apart from each other in the first direction under each section of the active pattern. Each section of the buried isolation pattern extends from a lower portion of the field isolation pattern in a second direction perpendicular to the first direction. At least one gate structure is disposed on each section of the active pattern, and an impurity region is located adjacent to the gate structure at the upper surface of the active pattern. The impurity region is spaced from the buried isolation pattern in a third direction perpendicular to the first and second directions. The buried isolation pattern offers a control on the body effect caused by a bias applied to the substrate.

19 Claims, 16 Drawing Sheets

SEMICONDUCTOR DEVICE AND METHOD OF MANUFACTURING THE SAME

BACKGROUND OF THE INVENTION

1. Field of the Invention

The present invention relates to a semiconductor device and to a method of manufacturing the same. More particularly, the present invention relates to field effect transistors (FETs) and to the body effect in semiconductor devices having FETs.

2. Description of the Related Art

The relationship between the gate voltage of a field effect transistor and in particular, metal-oxide semiconductor (MOS) device, and the electrical field which operates the transistor is largely affected when the channel length of the transistor is reduced. That is, reductions in the channel length produce what are widely known as short channel effects. For example, the threshold voltage of the transistor is lowered by short channel effects. In particular, the operation of the transistor becomes more influenced by electrons in the depletion region and the voltages of the source/drain regions than by the gate voltage in the transistor when the channel length is reduced. MOS transistors are basic units of memory devices such as dynamic random access memory (DRAM) devices. Specifically, the MOS transistors act as switches in a DRAM device. DRAM devices are usually required to operate at high speeds and to have the capacity to store large amounts of data. Thus, DRAM devices are being produced with greater numbers of cells located on one semiconductor substrate, and greater numbers of transistors in each cell. In order to increase the degree of integration of each cell on the substrate, the gates of the transistors of the DRAM device must be narrow. However, the narrower the gate is, the shorter the channel length, and short channels can cause various malfunctions in a DRAM such as dynamic failures and static refresh failures.

A recessed channel structure has been proposed for preventing short channel effects in DRAM devices. In a DRAM having a recessed channel structure, the gate electrode of the transistor is located in a recess in the substrate, so that the channel region under the gate electrode has a sufficient length even though the gate is narrow.

The substrate bias is a significant factor in the performance of a MOS transistor as a switch. In particular, the substrate bias has an influence on the threshold voltage. This is known as the body effect. In particular, the greater the body effect is, the easier it is for a MOS transistor to be operated with a small gate voltage. That is, the MOS transistor can be operated using less power and at a higher speed when the substrate bias is increased.

However, there is a problem in that the body effect in a recessed-type of MOS transistor is greater than that in a planar-type of transistor. Thus, the threshold voltage is higher in a recessed-type of transistor than in an otherwise comparable planar-type of transistor. Accordingly, the body effect makes it is difficult to integrate both recessed-type and planar-types of transistors.

SUMMARY OF THE INVENTION

Accordingly, an object of the present invention is to provide a semiconductor device in which the body effect is minimized.

Another object of the present invention is to provide a semiconductor device in which both recessed channel and planar types of transistors can be well integrated.

Another object of the present invention is to provide a method of manufacturing a semiconductor device by which the body effect can be controlled. According to an aspect of the present invention, there is provided a semiconductor device having a buried isolation pattern between the substrate and an active region at the upper portion of which a transistor is provided.

The active pattern has adjacent sections which extend longitudinally on the substrate. A field isolation pattern extends between the adjacent sections of the active pattern. The buried isolation pattern has a plurality of sections spaced apart from each other under each section of the active pattern in a first direction. The buried isolation pattern is preferably of a material substantially identical to that of the field isolation pattern. Each section of the buried isolation pattern extends from a lower portion of the field isolation pattern in a second direction perpendicular to the first direction. At least one gate structure is disposed on each section of the active pattern and an impurity region is located adjacent to each gate structure at an upper surface of the active pattern. The impurity region is spaced from the buried isolation pattern in a third direction perpendicular to the first and second directions.

According to another aspect of the invention, the gate structure and impurity region constitute a recessed channel type of transistor. In this case, the active pattern has a recess in an upper surface thereof, and a gate insulation layer and a conductive pattern occupy the recess. Furthermore, in a case in which two recessed channel type of transistors are provided on each section of the active pattern, the buried isolation pattern may have a central section under a central portion of each section of the active pattern. The central section of the buried isolation pattern is disposed under a source/drain region interposed between the gate structures of the transistors. The present invention may also be applied to a semiconductor device having a planar type of transistor. In this case, the gate structure includes a gate insulation layer and a conductive pattern stacked on the upper surface of the active pattern.

According to another aspect of the present invention, there is provided a semiconductor device having both recessed channel and planar types of transistors on an active pattern, and a buried isolation layer pattern interposed between at least the active pattern and the region of the substrate on which the recessed channel type of transistor(s) is disposed. Preferably, the buried isolation layer pattern is interposed between the active pattern and both regions of the substrate on which the recessed channel and planar types of transistors are disposed.

According to another aspect of the present invention, there is provided a method of manufacturing a semiconductor device which includes fabricating a buried field isolation region to a desired thickness between a substrate and an active pattern on which a transistor(s) is disposed. The active pattern is formed on a substrate. A field isolation pattern is formed between adjacent sections of the active pattern. A buried isolation pattern having sections spaced apart from each other in a first direction is formed under each section of the active pattern. Each section of the buried isolation pattern extends from the field isolation pattern in a second direction perpendicular to the first direction. A gate structure is formed on the active pattern, and an impurity region is formed adjacent to the gate structure at a surface of the active pattern. The impurity region is spaced from the buried isolation pattern in a third direction perpendicular to the first and second directions.

The active pattern may be formed by first forming a preliminary sacrificial pattern having an etching selectivity with respect to the substrate, and forming a silicon layer having substantially the same etching selectivity on the preliminary sacrificial pattern. Then, the silicon layer and the preliminary sacrificial layer are etched, to thereby form a preliminary active pattern defined by trenches, and a sacrificial pattern under the preliminary active pattern. The sacrificial pattern is then removed by an etch process so that a space is formed between the active pattern and the substrate. The etch process can also remove a portion of the substrate along with the sacrificial pattern.

The field isolation pattern and the buried isolation layer pattern may be formed by forming a first isolation layer on the substrate and the active pattern through a thermal oxidation process, and then by forming a second isolation layer to a thickness sufficient to fill any of the space left between the active pattern and the substrate and to fill the trenches and cover the active pattern. Then, a planarization process is performed to expose the active pattern.

Alternatively, the field isolation pattern and the buried isolation layer pattern may be formed by forming a first isolation layer on the substrate and the active pattern to a thickness sufficient to fill up the space between the active pattern and the substrate, and forming a second isolation layer on the first field isolation layer to a thickness sufficient to fill the trenches and cover the active pattern. Then, a planarization process is performed to expose the active pattern.

The gate structure or structures formed may be that or those of recessed channel and/or planar types of transistors.

According to the present invention, the buried isolation pattern serves to limit the body effect produced by the bias applied to the substrate. Furthermore, the buried isolation pattern is located under only the peripheral portions of each section of the active pattern on which planar type of transistors are provided. Therefore, impurities of source/drain structures of one transistor are prevented from diffusing into second source/drain structures of a neighboring transistor. Accordingly, this also allows for an increase in the degree to which the semiconductor device can be integrated.

BRIEF DESCRIPTION OF THE DRAWINGS

The above and other objects, features and advantages of the present invention will become more readily apparent by referring to the following detailed description of the preferred embodiments thereof made in conjunction with the accompanying drawings, in which.

DETAILED DESCRIPTION OF THE PREFERRED EMBODIMENTS

Figure 1:
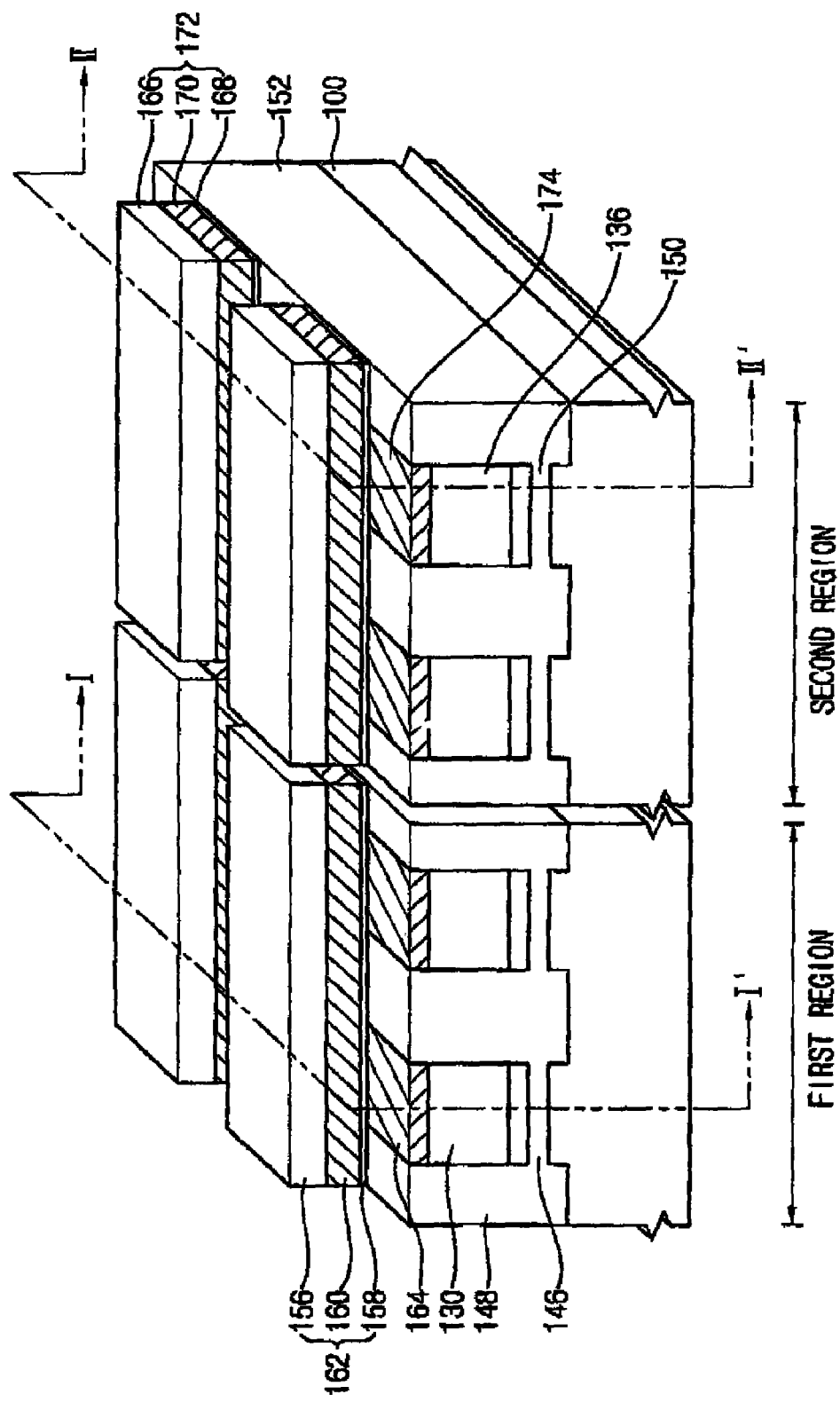
FIG. 1 is a perspective view of a semiconductor device in accordance with the present invention.

The present invention will be described below in more detail with reference to the accompanying drawings. It is to be noted, though, that the dimensions of layers and regions and their shapes are exaggerated in the drawings for clarity of illustration. Also, like reference numerals designate like elements throughout the drawings.

Furthermore, when an element or layer is referred to in the written description as being disposed 'on' another element or layer, it means that such an element or layer can be either directly on the other element or layer, or that intervening elements or layers may be present therebetween. Also, when an element or layer is referred to as being 'under' or 'over' another layer or element, it means either that the element or layer can be directly under or over the other element or layer, or that one or more other elements or layers may be present therebetween. However, such terms as 'on', 'under' and 'over' do indicate a vertical alignment of the elements or layers in question as shown in the orientation depicted in drawings. Obviously, though, all such spatially relative terms refer to the orientation shown in the drawings for ease of description and are not necessarily limiting as the invention can assume a different orientation in use.

Figure 9:
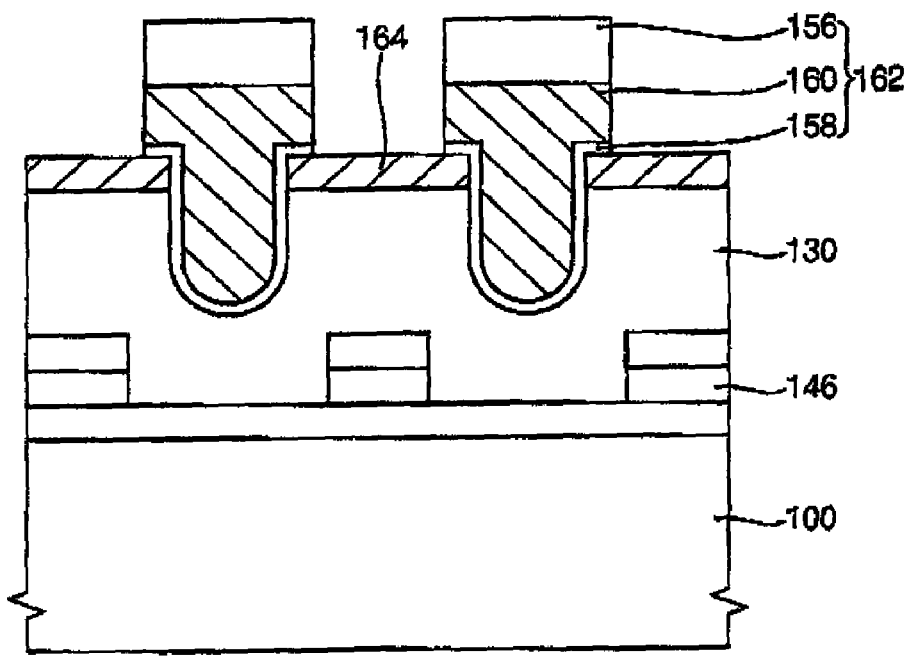
FIG. 9 is a cross-sectional view of the semiconductor device taken along line I-I' in FIG. 1.
Figure 17:
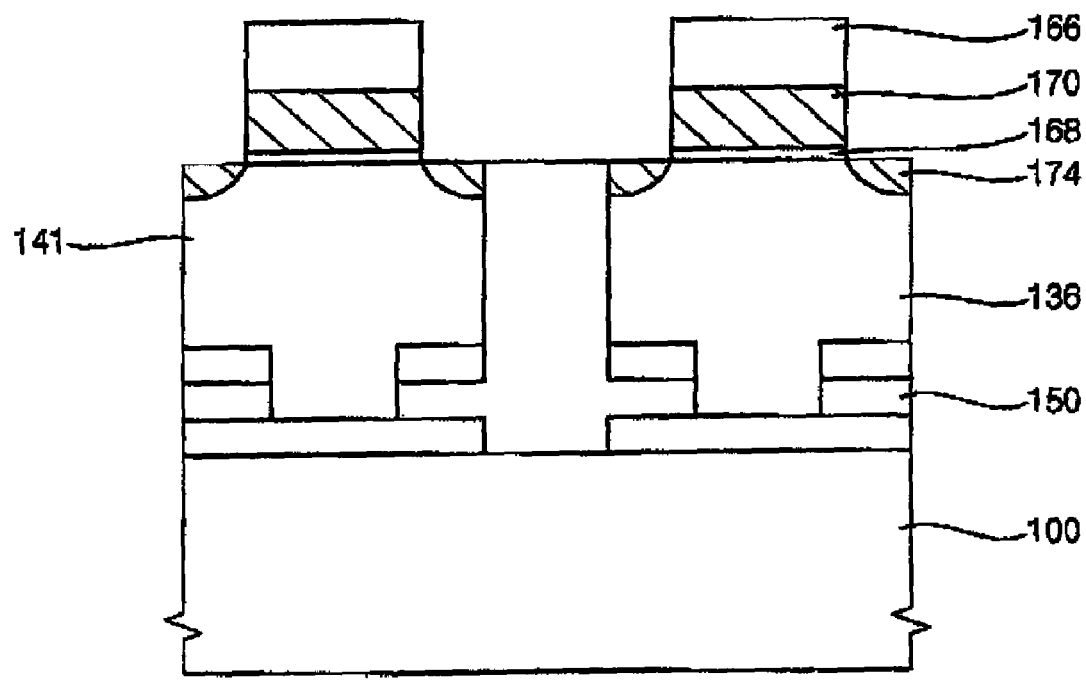
FIG. 17 is a cross-sectional view of the semiconductor device taken along line II-II' in FIG. 1.

Referring to FIGS. 1, 9 and 17, a semiconductor device according to the present invention includes a semiconductor substrate 100, first and second active patterns 130 and 136, first and second field isolation patterns 148 and 152, first and second transistors, and first and second buried isolation patterns 146 and 150. The semiconductor substrate 100 comprises silicon (Si) or germanium (Ge). In the present embodiment, the substrate 100 comprises single-crystalline silicon.

Furthermore, the substrate 100 may have protrusions at the upper surface thereof, as shown in FIG. 1. Also, the substrate 100 has a first region and a second region. The first region of the substrate may be a cell region at which a memory cell comprising metal-oxide semiconductor (MOS) transistors (hereinafter "cell transistors") is located and the second region of the substrate may be a peripheral region at which a circuit comprising transistors (hereinafter "peripheral transistors") for driving and controlling the memory cell is located.

The first active pattern 130 is disposed on the first region of the substrate 100. More particularly, the first active pattern 130 is made up of sections which extend longitudinally in a first direction on the first region of the substrate 100. The first active pattern 130 may have substantially the same composition as the substrate 100 and thus, the first active pattern 130 may comprise single-crystalline silicon. Also, the first transistors (described later) are located on the first active pattern 130. The geometry of the upper portion of the first active pattern 130 thus depends on the first transistors located on the first active pattern 130. For example, the upper portion of the first active pattern 130 is flat when the first transistors are planar transistors. On the other hand, the upper potion of the first active pattern 130 has recesses therein when the first transistors are recessed channel transistors (RCT).

The first buried isolation pattern 146 is disposed on the first region of the substrate 100 under the first active pattern 130. That is, the first active pattern 130 is separated from the substrate 100 by the buried isolation pattern 146. In particular, when the substrate 100 has protrusions as shown in FIGS. 1 and 9, the first buried isolation pattern 146 is disposed on the protrusions.

The first transistors include first gate structures 162 and first source/drain structures 164. The first gate structures 162 may comprise a first gate isolation pattern 158, a first conductive pattern 160 and a first mask pattern 156. Each of the first gate structures 162 extends longitudinally in a second direction perpendicular to the first direction.

In the case in which the first transistors are of a planar type, the first gate isolation pattern 158, the first conductive pattern 160 and the first mask pattern 156 are stacked in the foregoing sequence on the upper surface of the first active pattern 130. Also, the first source/drain structures 164 are located on opposite sides the first gate structures 162 at the upper portion of the first active pattern 130.

In the case in which the first transistors are of a recessed channel type, the bottoms of the recesses in the first active pattern 130 are located at a level above the first buried isolation pattern 146. Also, the first gate isolation pattern 158 extends along part of the upper surface the first active pattern 130 and along inner surfaces of the first active pattern 130 which define the recesses. The first conductive pattern 160 includes a lower portion that fills the recesses in the first active pattern 130 and an upper portion that protrudes from the upper surface of the first active pattern 130. The first mask pattern is disposed on the first conductive pattern 160. The first source/drain structures 162 are located on opposite sides of the first gate structures 162 at the upper portion of the first active pattern 130.

The first field isolation pattern 148 is interposed between adjacent ones of the longitudinally extending sections of the first active pattern 130 and may comprise an oxide such as silicon oxide, as is described in detail hereinafter.

As shown in FIGS. 1 and 9, the first buried isolation pattern 146 is located under a central portion of the first active pattern 130 as well as under a peripheral portion thereof. That is, the buried isolation pattern 146 may be located under the source/drain structures 164 or under a channel region. The buried isolation pattern 146 may be integrated with the first field isolation pattern 148 so as to extend from the first field isolation pattern 148. In the present embodiment, the first field isolation pattern 148 and the first buried isolation pattern 146 are unitary and thus, the first buried isolation pattern 146 comprises the same material as the first field isolation pattern 148.

Also, the first buried isolation pattern 146 may contact the substrate 100, the first active pattern 130 and the first field isolation pattern 148, but does not contact the first gate isolation pattern 158 or the first source/drain structures 164. The present invention, though, is not limited to any particular other aspect of the buried isolation pattern 146 such as the geometry of the buried isolation pattern 146 or the spacing between adjacent sections thereof. Rather, as disclose above, the buried isolation pattern 146 must only be located under the first active pattern 130 as separated from the first gate isolation pattern 158 and the first source/drain structures 164.

The second active pattern 136 has sections which each extend longitudinally along the first direction on a second region of the substrate 100. The second active pattern 136 may have substantially the same structure and composition as the substrate 100, and thus the second active pattern 136 may comprise single-crystalline silicon. The second transistors (described later) are located on the second active pattern 136.

The geometry of the upper portion of the second active pattern 136 depends on the structure of the second transistors located on the second active pattern 136. In the present embodiment, the second transistors are of a planar type. Therefore, the upper surface of the second active pattern 136 is flat.

The second transistors include second gate structures 172 and second source/drain structures 174. The second gate structures 172 extend in the second direction and may comprise a second gate isolation pattern 168, a second conductive pattern 170 and a second mask pattern 166.

In the present embodiment in which the second transistors are of a planar type, the second gate isolation pattern 168, the second conductive pattern 170 and the second mask pattern 166 are stacked on the flat upper surface of the second active pattern 136. The second source/drain structures 174 are located at the upper portion of the second active pattern 136 on opposite sides of the second gate structures 172.

The second field isolation pattern 152 is interposed between adjacent ones of the longitudinally extending sections of the second active pattern 136 and may comprise an oxide such as silicon oxide. That is, the second field isolation pattern 152 may comprise the same material as the first field isolation pattern 148. Also, in the present embodiment, the second field isolation pattern 152 is integrated with the second buried isolation pattern 150. In this respect, the second buried isolation pattern 150 and the second field isolation pattern 152 may be unitary. Thus, the second field isolation pattern 152 may comprise the same material as the second buried isolation pattern 150.

The second buried isolation pattern 150 is disposed under the second active pattern 136. That is, the second buried isolation pattern 150 is interposed between the second active pattern 136 and the substrate 100. More specifically, the second buried isolation pattern 150 extends under the second active pattern 136 from the second field isolation pattern 152. Also, the second buried isolation pattern 150 may contact the substrate 100, the second active pattern 136 and the second field isolation pattern 152. However, the second buried isolation pattern 150 does not contact either the second gate isolation pattern 168 or the second source/drain structures 174. The present invention, though, is not limited to any particular other aspect of the buried isolation pattern 150 such as the distance between adjacent sections of the second buried isolation pattern 150 or the surface area of the second buried isolation pattern relative to the second active pattern 136.

Furthermore, as shown in FIGS. 1 and 17, the second buried isolation pattern 150 is located only under peripheral portions of the second active pattern 136. Therefore, impurities of the second source/drain structures 174 that are disposed at the upper portion of the second active pattern 136 can be prevented from diffusing into neighboring second source/drain structures 174, because the second buried isolation pattern 150 effectively increases the diffusion path, i.e., the path along which the impurities could otherwise diffuse between adjacent second source/drain structures 174. Furthermore, the distance between adjacent sections of the second active pattern 136 in the first direction is effectively decreased by an amount corresponding to the effective increase in the diffusion path. Thus, the second buried isolation pattern 150 allows the degree of integration of the semiconductor device to be increased.

A method of manufacturing the semiconductor device shown in FIGS. 1, 9 and 17 will now be described with reference to FIGS. 2-8, 10-16 and 18-23.

Figure 2:
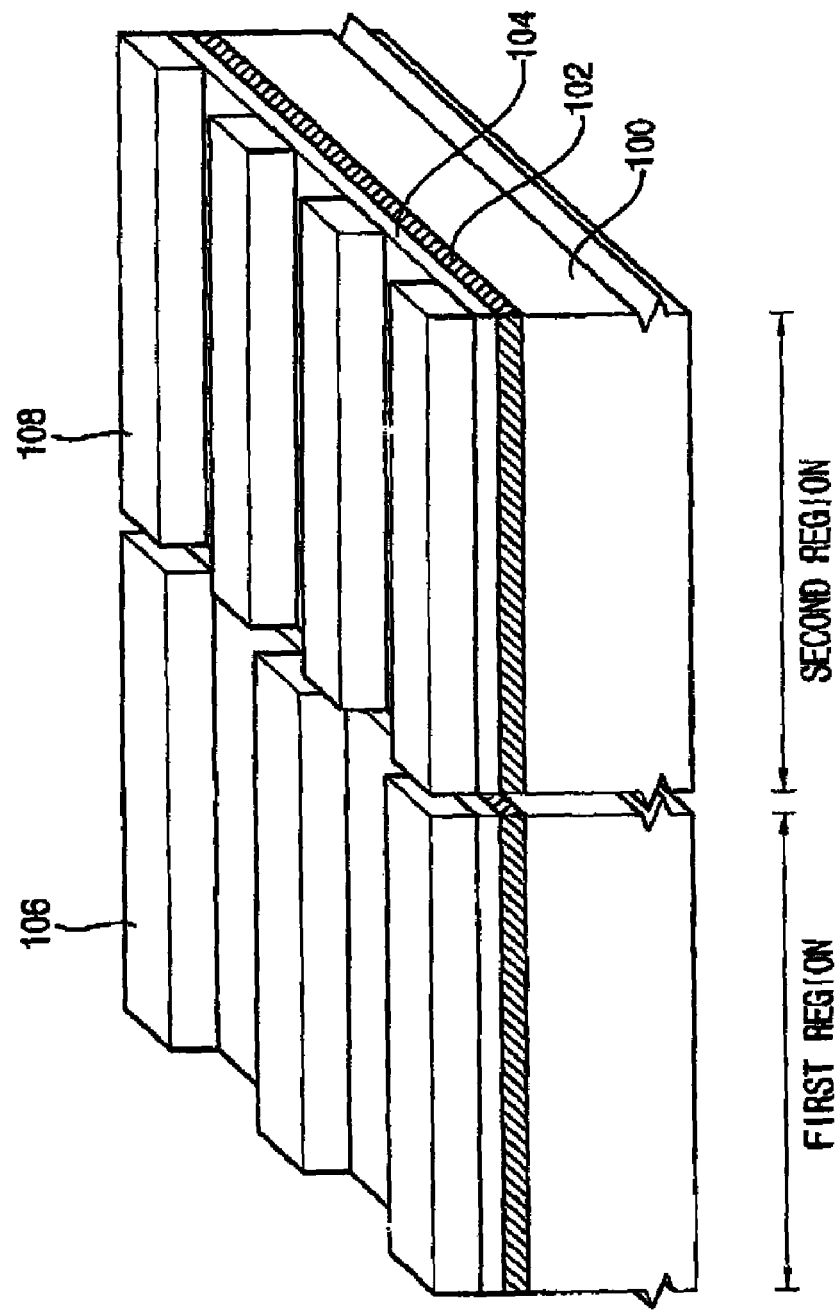
FIGS. 2 to 8 are perspective views of intermediate products of the semiconductor device, respectively, and together illustrating the manufacturing of the semiconductor device.
Figure 10:
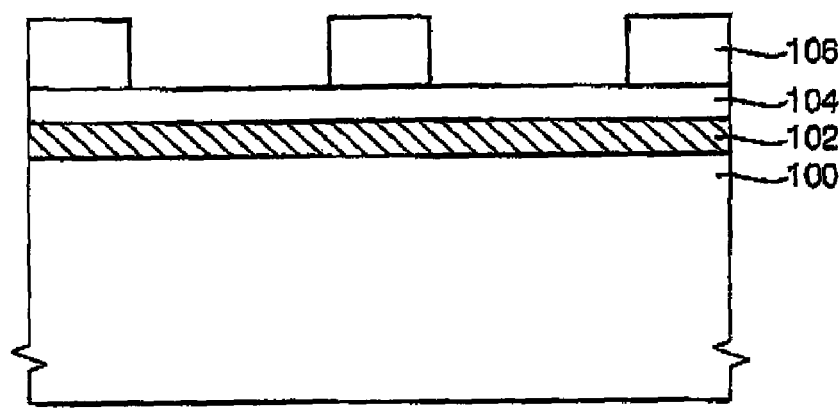
FIGS. 10 to 16 are cross-sectional views of intermediate products of the semiconductor device illustrating the manufacturing of that portion of the semiconductor device shown in FIG. 9.
Figure 18:
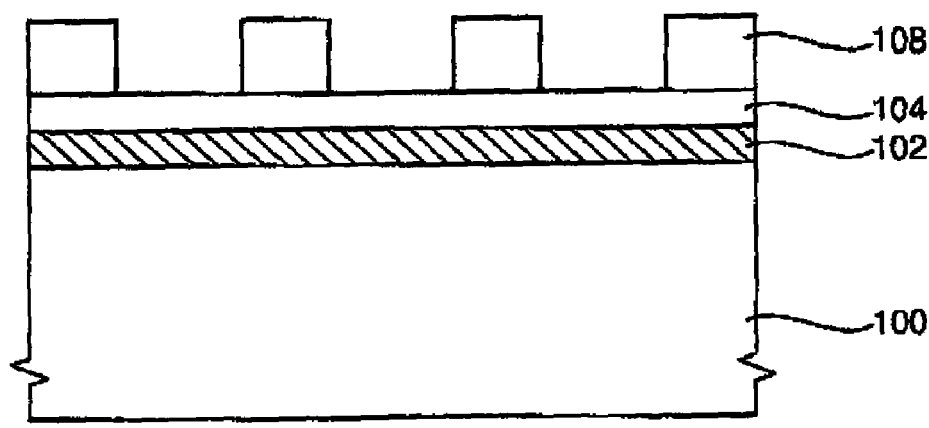
FIGS. 18 to 23 are cross-sectional views of intermediate products of the semiconductor device illustrating the manufacturing of that portion of the semiconductor device shown in FIG. 17.

Referring first to FIGS. 2, 10 and 18, first, a sacrificial layer 102 having an etching selectivity with respect to the substrate 100 may be formed on the first and second regions of the substrate 100 by a first epitaxial growth process. For example, the substrate 100 may be exposed to source gas comprising silicon and a source gas comprising germanium. Then, the substrate 100 is used as a seed layer to grow the silicon/germanium as the sacrificial layer 102. As a result, the sacrificial layer 102 has the same crystalline structure as the substrate 100. That is, the sacrificial layer 102 comprises single-crystalline silicon germanium.

Optionally, a silicon layer 104 is then formed on the sacrificial layer 102 by a second epitaxial growth process. For example, the substrate 100 including the sacrificial layer 102 is exposed to a source gas comprising silicon. Then, the sacrificial layer 102 is used as a seed layer to grow the silicon as the silicon layer 102. As a result, the silicon layer 104 has the same crystalline structure as the sacrificial layer 102. That is, the silicon layer 104 has a single-crystalline structure.

Next, a first mask pattern 106 is formed atop the silicon layer 104 on the first region of the substrate 100 and a second mask pattern 108 is formed atop the silicon layer 104 on the second region of the substrate 100. The first and second mask patterns 106 and 108 have (linear) sections which extend longitudinally in a first direction.

Figure 3:
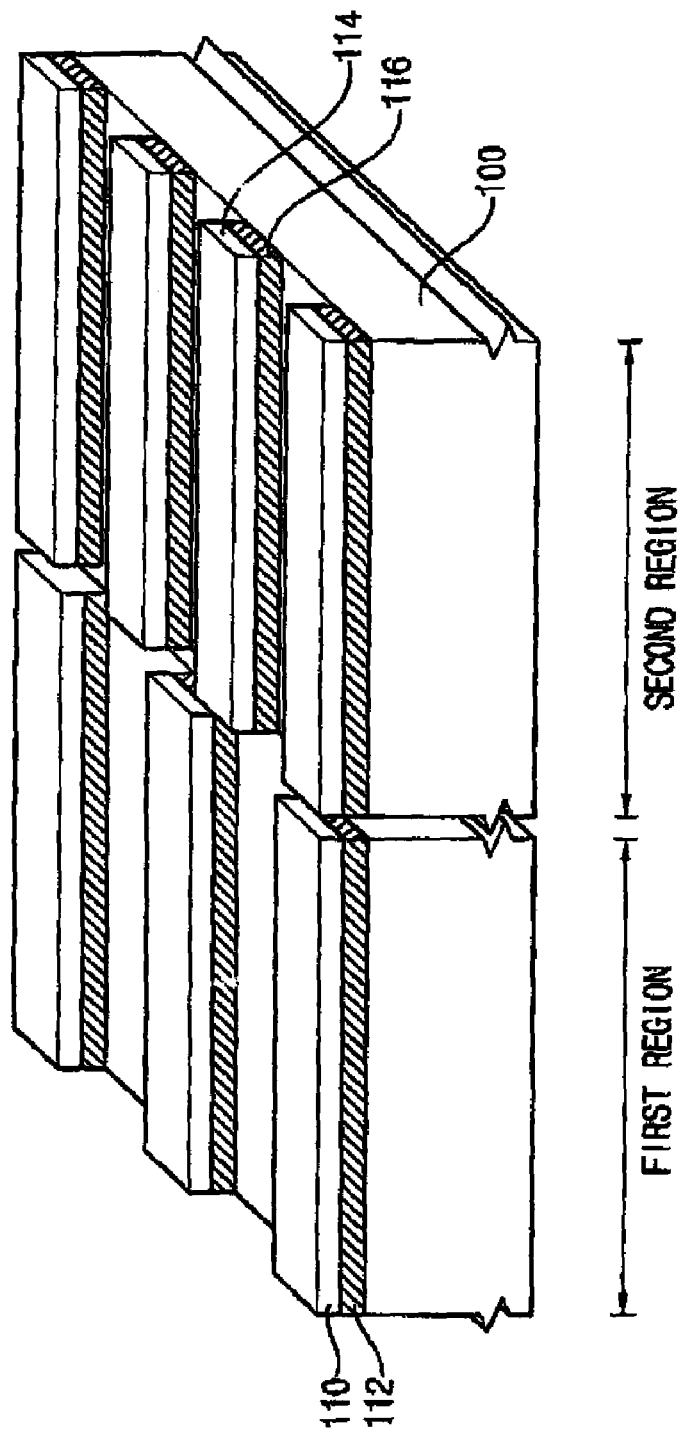
Figure 11:
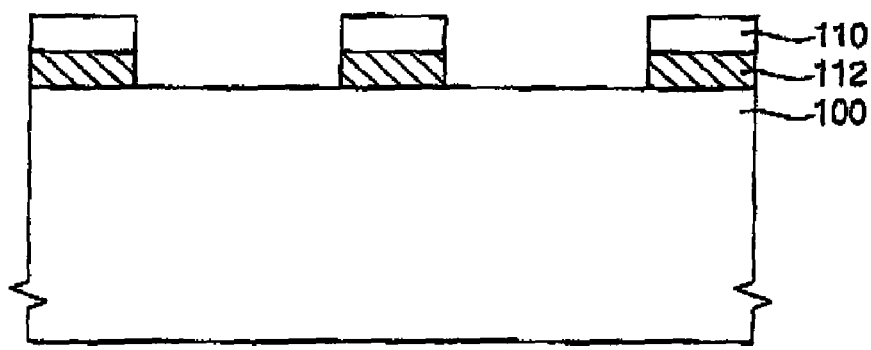
Figure 19:
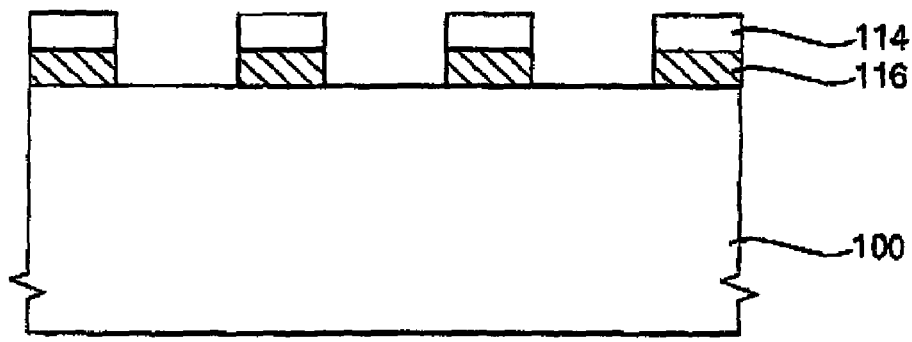

Referring to FIGS. 3, 11 and 19, the silicon layer 104 and the sacrificial layer 102 are etched using the first and second mask patterns as an etching mask. As a result, a first preliminary sacrificial pattern 112 and a first preliminary silicon pattern 110 are formed on the first region of the substrate 100, and a second preliminary sacrificial pattern 116 and a second preliminary silicon pattern 114 are formed on the second region of the substrate 100. Subsequently, the first and second mask patterns are removed.

Figure 4:
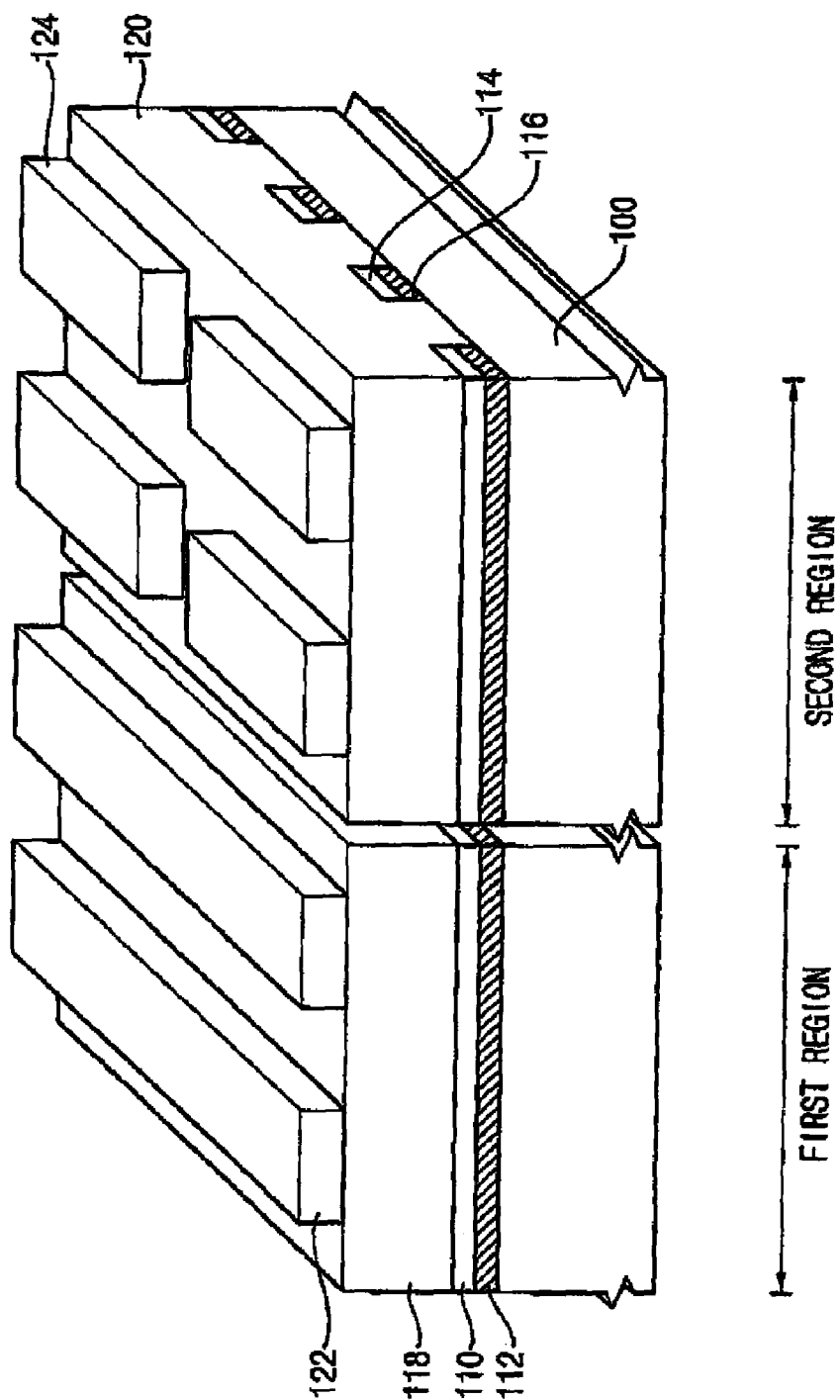
Figure 12:
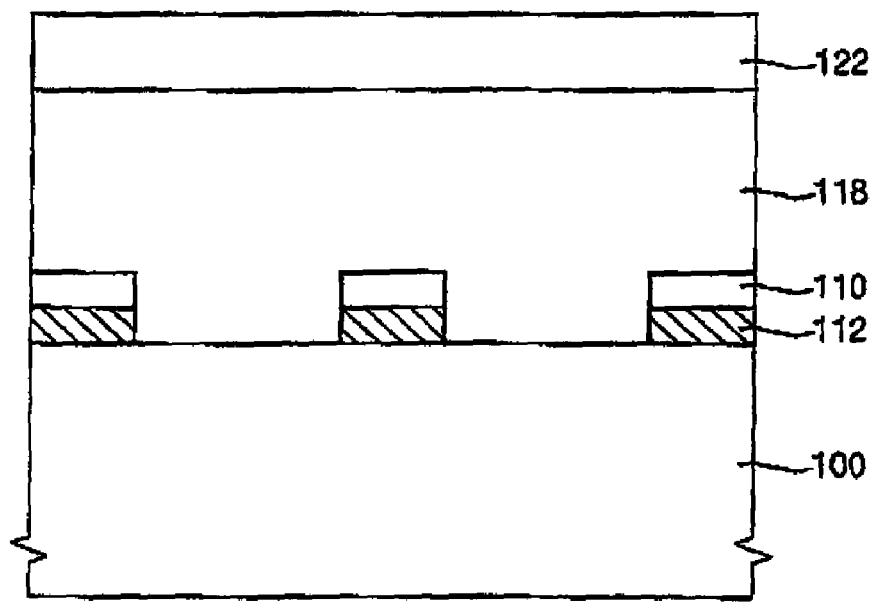
Figure 20:
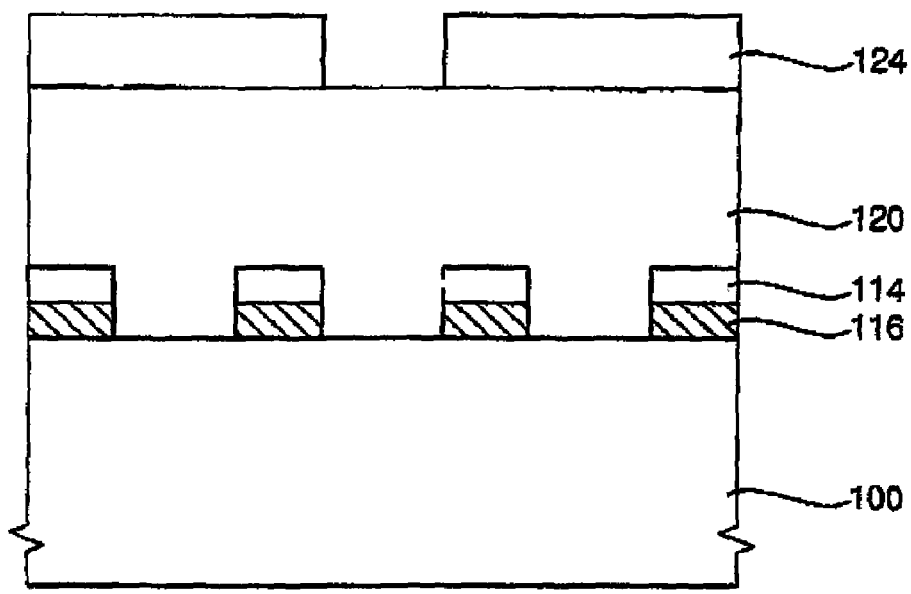

Referring to FIGS. 4, 12 and 20, a third silicon layer 118 is formed on the first region of the substrate 100 to a thickness sufficient to cover the first preliminary sacrificial pattern 112 and the first preliminary silicon pattern 110. Thus, the interstices between the sections of the first preliminary sacrificial pattern 112 and between the sections of the first preliminary silicon pattern 110 are filled by the third silicon layer 118.

A fourth silicon layer 120 is formed on the second region of the substrate 100 to a thickness sufficient to cover the second preliminary sacrificial pattern 116 and the second preliminary silicon pattern 114. Thus, the interstices between the sections of the second preliminary sacrificial pattern 112 and between the sections of the second preliminary silicon pattern 110 are filled by the fourth silicon layer 120.

The third and fourth silicon layers 118 and 120 may be formed on the substrate 100 simultaneously or individually (sequentially). Also, the third and fourth silicon layers 118 and 120 may be formed on the substrate 100 by a third epitaxial growth process. For example, the substrate 100 may be exposed to a source gas comprising silicon. Then, the silicon is grown on the exposed portions of the first region of the substrate using the substrate 100 as a seed layer to form the third silicon layer 118. Likewise, silicon is grown on the exposed portions of the second region of the substrate using the substrate 100 as a seed layer to form the fourth silicon layer 120. In the present embodiment, the third and fourth silicon layers 118 and 120 have the same crystalline structure as the first preliminary sacrificial pattern 112, the first preliminary silicon pattern 110, the second preliminary sacrificial pattern 116, the second preliminary silicon pattern 114 and the substrate 100. That is, the third and fourth silicon layers 118 and 120 have a single-crystalline structure.

Then, a third mask pattern 122 is formed on the third silicon layer 118 and a fourth mask pattern 124 is formed on the fourth silicon layer 120. The third and fourth mask patterns are made up of sections which extend longitudinally in a second direction different from the first direction. In the present embodiment, the second direction is perpendicular to the first direction.

Figure 5:
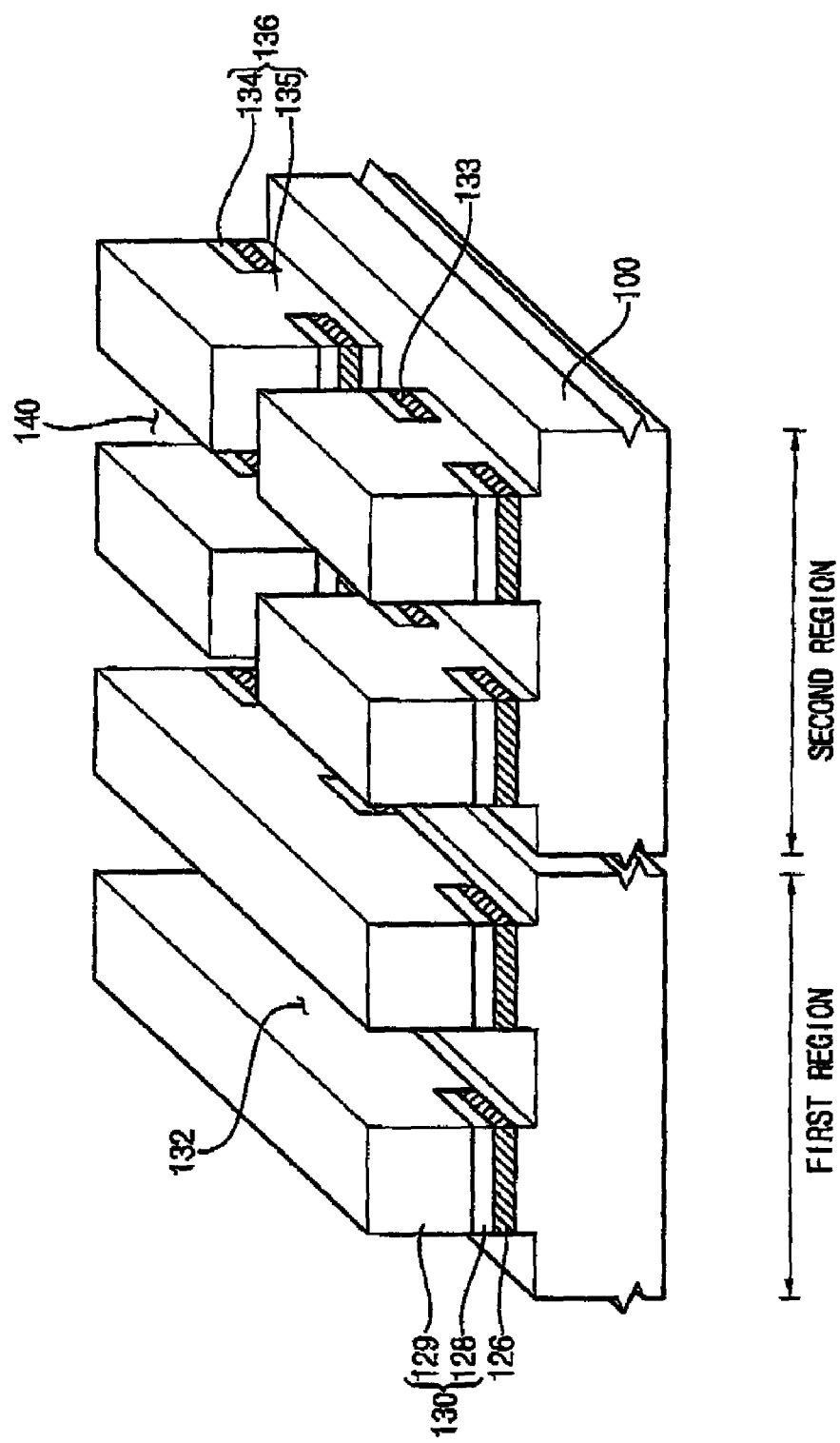
Figure 13:
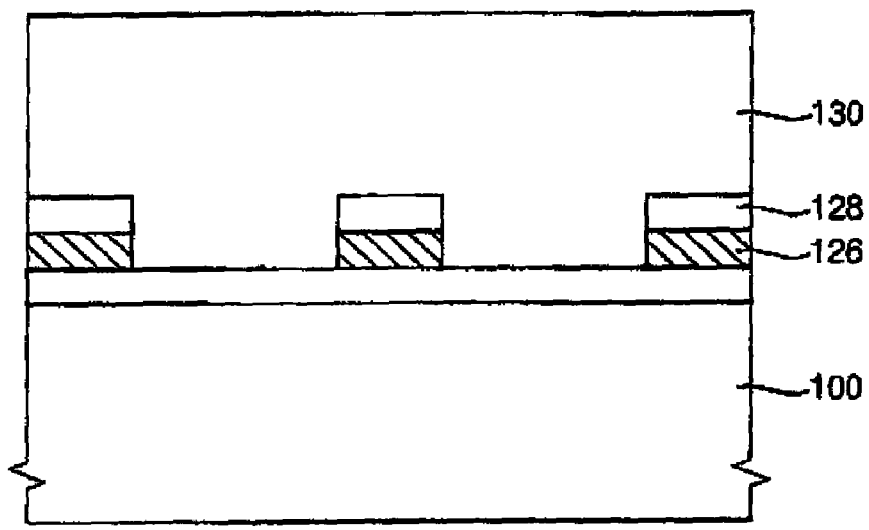
Figure 21:
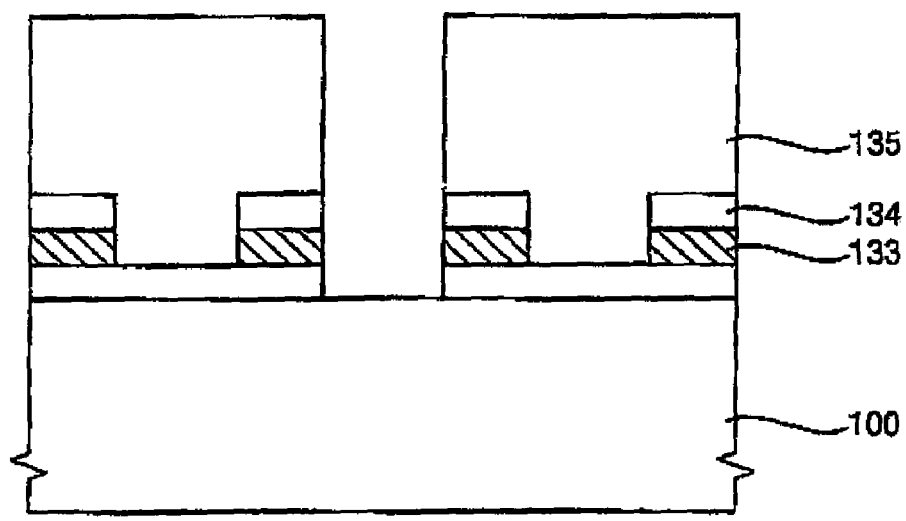

Referring to FIGS. 5, 13 and 21, the third silicon layer 118, the first preliminary silicon pattern 110 and the first preliminary sacrificial pattern 112 are etched using the third mask pattern 122 as an etch mask, to thereby form first trenches 132. The fourth silicon layer 120, the second preliminary silicon pattern 114 and the second preliminary sacrificial pattern 116 are etched using the fourth mask pattern 124 as an etch mask, to thereby form second trenches 140. As a result, a first sacrificial pattern 126, and a first silicon pattern 128 and a third silicon pattern 129 constituting the first active pattern 130, are formed on the upper surface of the first region of the substrate 100. Similarly, a second sacrificial pattern 133, and a second silicon pattern 134 and a fourth silicon pattern 135 constituting the second active pattern 136, are formed on the upper surface of the second region of the substrate 100. An upper portion of the substrate 100 may be also be etched so that the bottoms of the first and second trenches 132 and 140 lie at a level below the upper surface of the substrate 100. FIG. 5 shows this aspect in the first region of the substrate 100, i.e., in connection with the first trench 132.

Next, the third and fourth mask patterns 122 and 124 are removed from the first and second active patterns 130 and 136.

Figure 6:
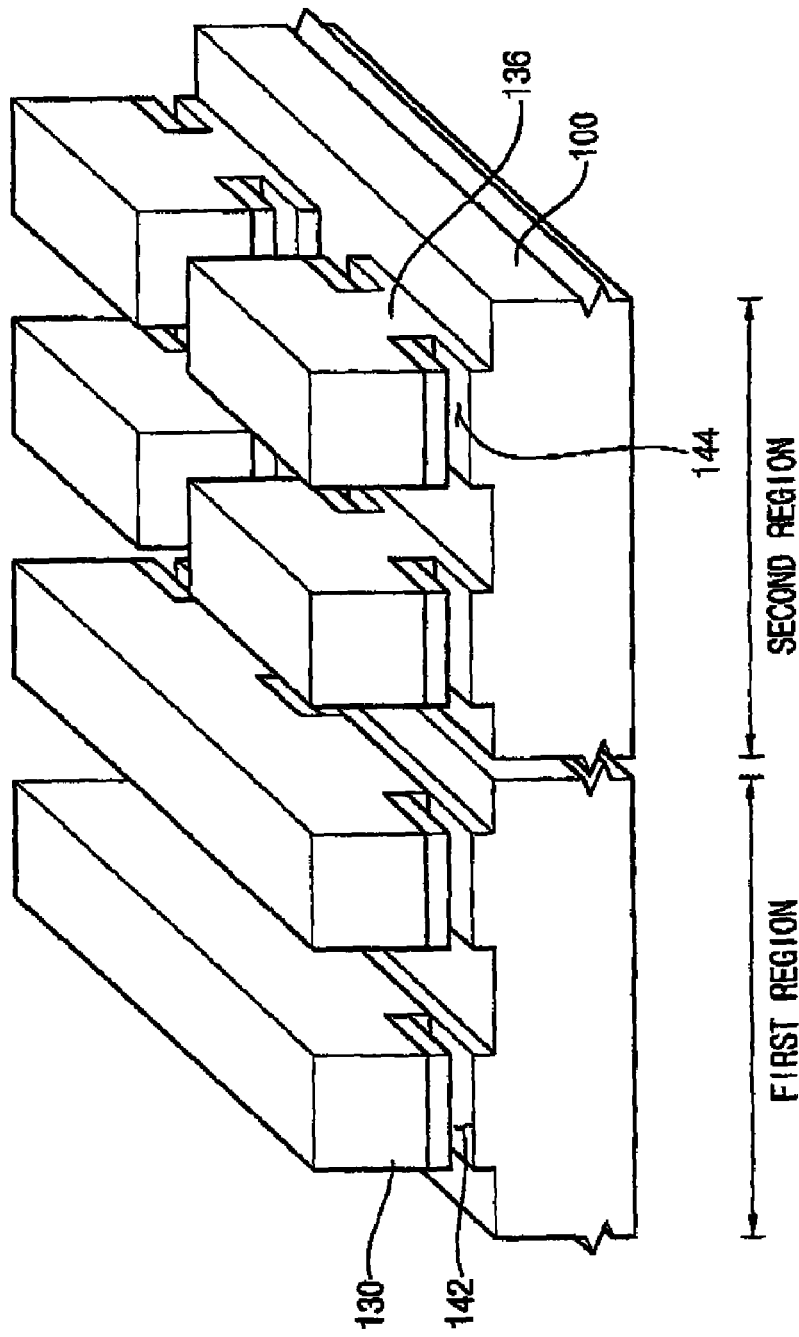
Figure 14:
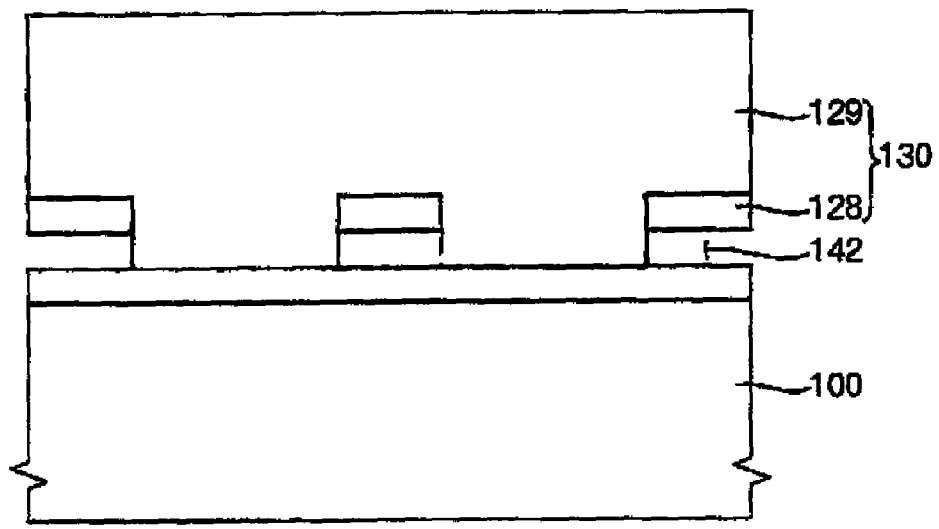
Figure 22:
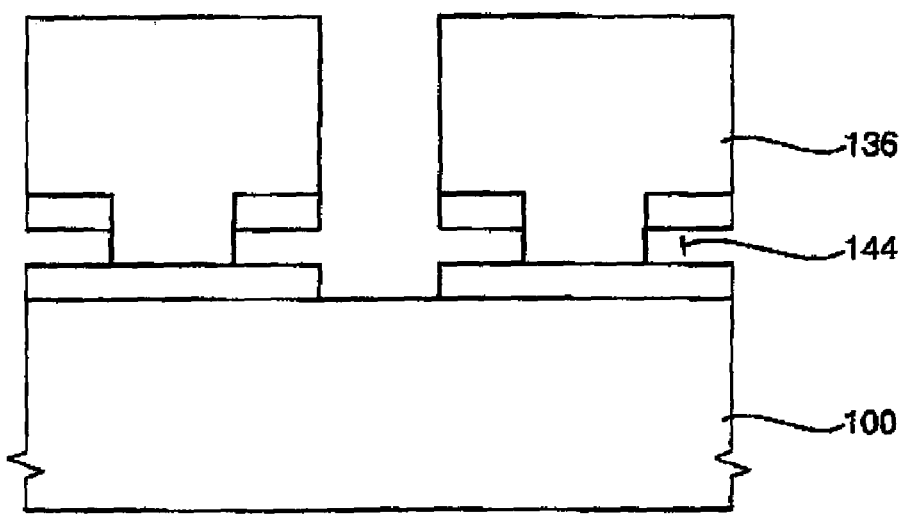

Referring to FIGS. 6, 14 and 22, the first and second sacrificial patterns 126 and 133 are removed from the substrate 100.

In the present embodiment, the first and second sacrificial patterns 126 and 133 may be removed from the substrate 100 by an etching process using an etchant having an etch selectivity with respect to silicon because the first and second sacrificial patterns 126 and 133 comprise silicon germanium whereas the substrate 100, and the first and second active patterns 130 and 136 comprise silicon. Thus, the first and second sacrificial patterns 126 and 133 are removed from the substrate 100 without removing any of the first and second active patterns 130 and 136. Accordingly, a first space 142 is formed between the first active pattern 130 and the substrate 100 and a second space 144 is formed between the second active pattern 136 and the substrate 100. More specifically, the first space 142 is made up of several openings under peripheral portions (ends) and a central portion of each longitudinally extending section of the first active pattern 130, respectively. The second space 144 is made up of pairs of openings under peripheral portions (ends) of each longitudinally extending section of the second active pattern 136, respectively.

Figure 7:
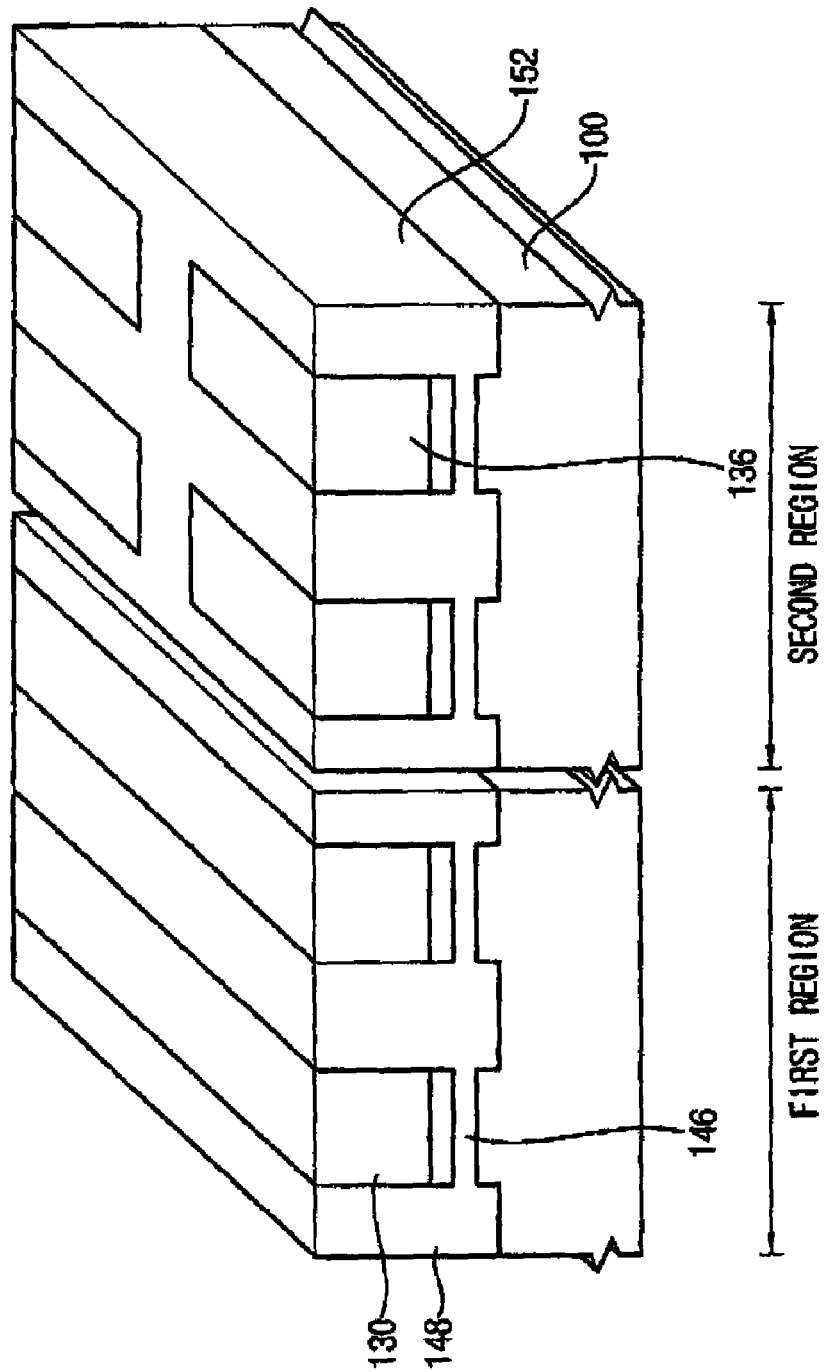
Figure 15:
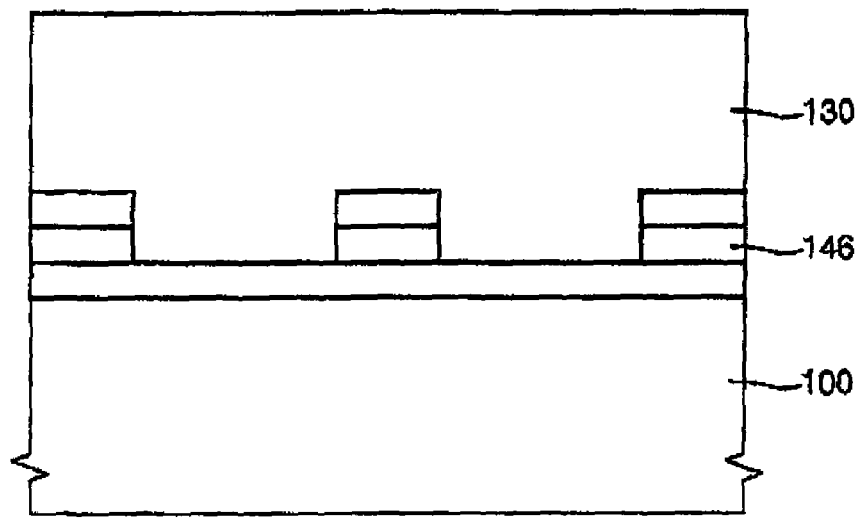
Figure 23:
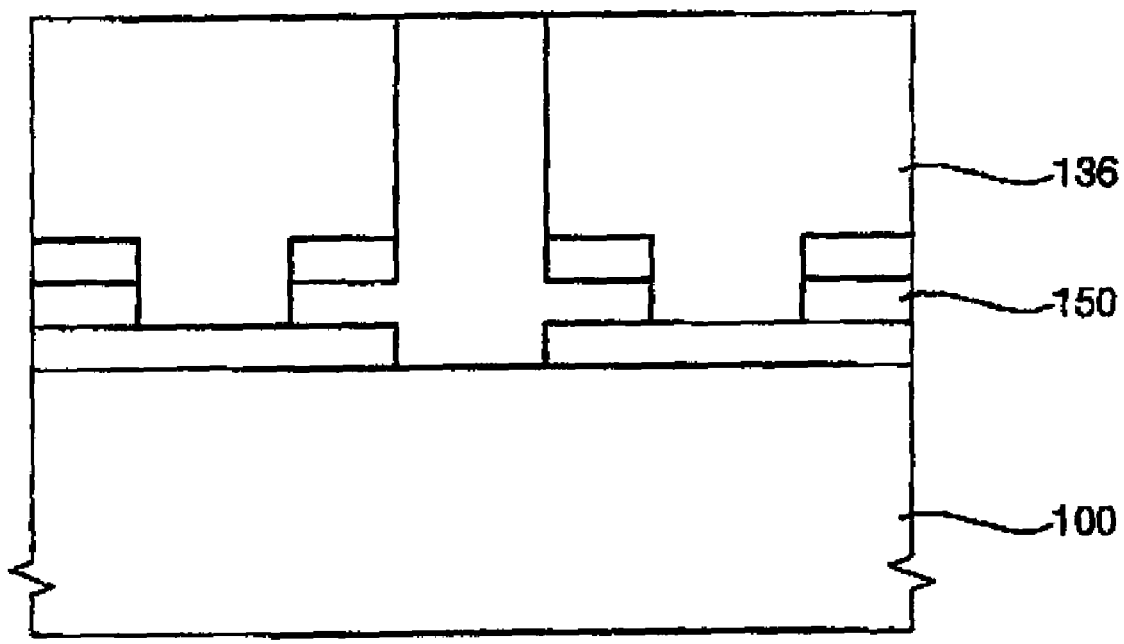

Referring to FIGS. 7, 15 and 23, a first field isolation pattern 148 is formed on the first region of the substrate 100 to a thickness sufficient to fill the first space 142 and the first trenches 132. A second field isolation pattern 152 is formed on the second region of the substrate 100 to a thickness sufficient to fill the second space 144 and the second trenches 140.

More specifically, in the present embodiment, the substrate 100 is first subjected to a thermal oxidation process, to thereby form a first field isolation layer (not shown). In particular, the first and second spaces 142 and 144 are filled with the first isolation layer, to thereby form a first buried isolation pattern 146 and a second buried isolation pattern 150 in the first and second spaces 142 and 144. Then, a second isolation layer (not shown) is formed to a thickness sufficient to fill the first trenches 132 and the second trenches 140. The second isolation layer may comprise an oxide such as undoped silicate glass (USG), a flowable oxide (FOx), plasma-enhanced tetraethyl orthosilicate (PE-TEOS), fluorosilicate glass (FSG), Tonen silazene (TOSZ), ozone tetraethyl orthosilicate undoped silicate glass ($O_3$-TEOS USG) or a high-density plasma oxide. Note, though, if the first and second spaces 142 and 144 are not entirely filled by the first isolation layer formed using the thermal oxidation process, the second field isolation layer may fill the remainder of the first and second spaces 142 and 144, to thereby complete the forming of the first buried isolation pattern 146 and the second buried isolation pattern 150 in the first and second spaces 142 and 144.

Then, the second isolation layer is polished, for example, until the upper surfaces of the first and second active patterns 130 and 136 are exposed. This completes the forming of the first field isolation pattern 148 on the first region of the substrate 100 and the second field isolation pattern 152 on the second region of the substrate 100. The polishing process may be a chemical mechanical polishing (CMP) process, an etch-back process or a combination of CMP and etch-back processes.

Also, according to an aspect of the present invention, a thermal oxide layer (not shown) may be formed at inner surfaces delimiting the first and second spaces 142 and 144 and the first and second trenches 132 and 140, to thereby cure any damage to the surfaces that delimit the first and second trenches 132 and 140. A nitride liner (also not shown) may be then formed on the thermal oxide layer. The nitride liner can prevent impurities in the first source/drain regions or the second source/drain regions from diffusing outward. The first and second spaces 142 and 144 may be filled with the thermal oxide layer and the nitride liner to form the first buried isolation pattern 146 and the second buried isolation pattern 150 in the first and second spaces 142 and 144.

Figure 8:
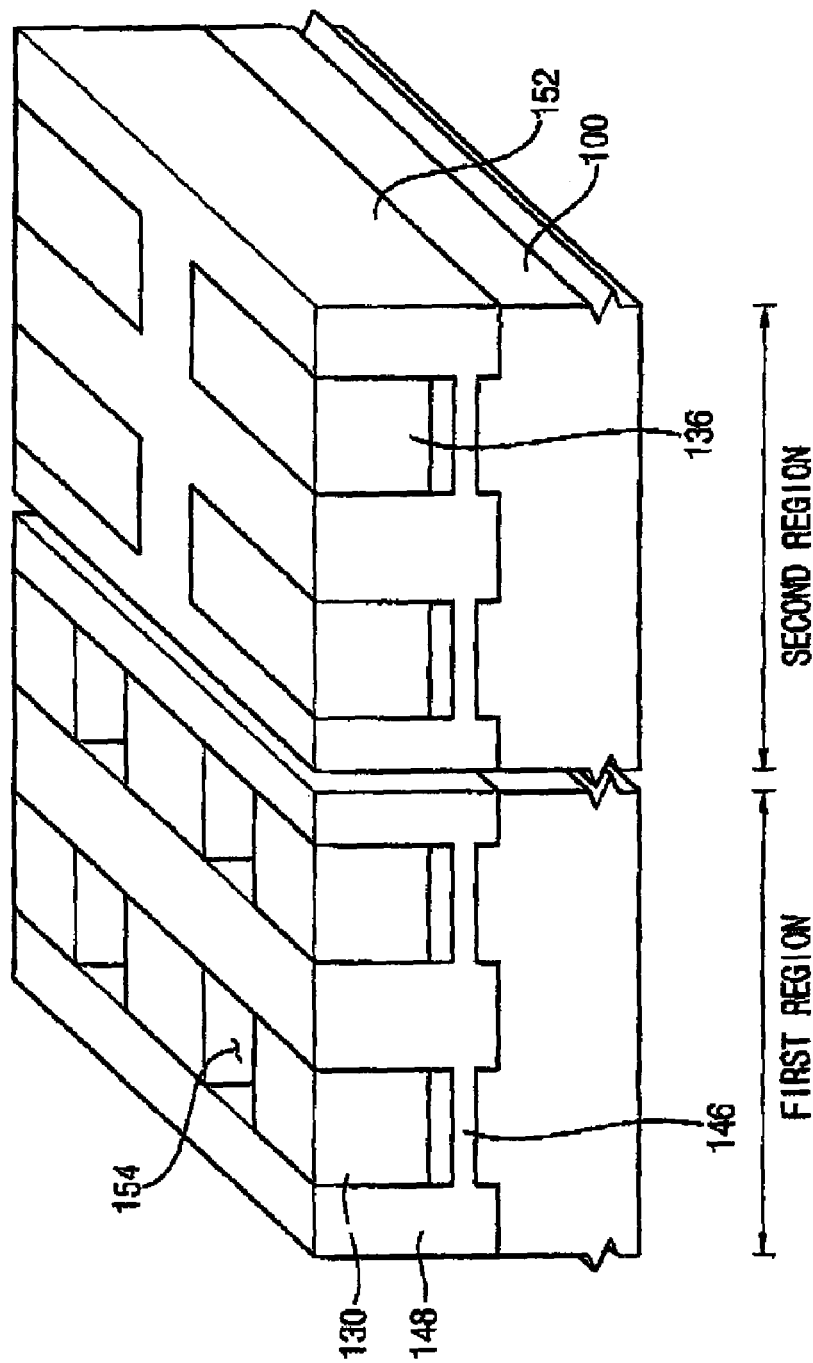
Figure 16:
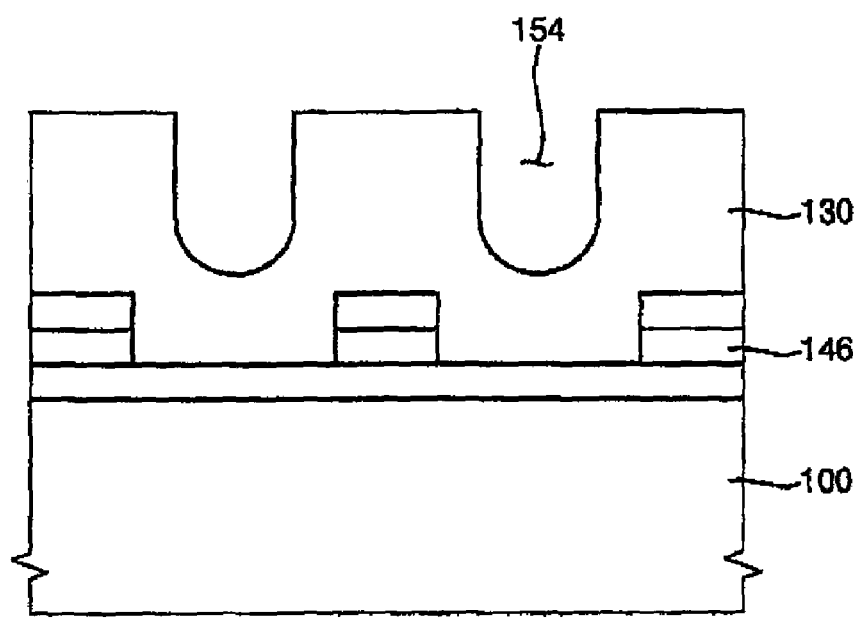

Referring to FIGS. 8 and 16, a fifth mask pattern (not shown) is formed on the first active pattern 130. The first active pattern 130 is etched using the fifth mask pattern as an etch mask, to thereby form recesses 154 in the first active pattern 130. Subsequently, the fifth mask pattern is removed from the first active pattern 130. In the present embodiment, the bottoms of the recesses 154 are located at a level higher than the upper surface of the first buried isolation pattern 146. Thus, the first buried isolation pattern 146 is not exposed by the recesses.

Referring again to FIGS. 1, 9 and 17, a first transistor is formed on the first active pattern 130 and a second transistor is formed on the second active pattern 136. In the present embodiment, a first gate insulation layer (not shown) is formed conformally on the first active pattern 130 by a chemical vapor deposition (CVD) process or a thermal oxidation process. The first gate insulation layer may comprise an oxide. Then, a first conductive layer (not shown) is formed on the first active pattern 130 to a thickness sufficient to fill the recesses portion 154. The first conductive layer may be a stack of conductive sub-layers. A sixth mask pattern 156 is formed on the first conductive layer, and the first conductive layer and the first gate insulation layer are etched using the sixth mask pattern as an etch mask, to thereby form the first gate structures 162. Subsequently, the first source/drain structures 164 are formed adjacent to the first gate structures 162 by techniques which are well known per se to those of ordinary skill in the art.

Also, a second gate insulation layer (not shown) is formed on the second active pattern 136. The second gate insulation layer may be substantially the same as the first gate insulation layer and, in this respect, may be part of the same layer which constitutes the first gate insulation layer. Then, a second conductive layer (not shown) is formed on the second gate insulation layer. The second conductive layer may also be substantially the same as the first conductive layer. A seventh mask pattern 166 is formed on the second conductive layer, and the second conductive layer and the second gate insulation layer are etched using the seventh mask pattern as an etch mask, to thereby form the second gate structures 172. Subsequently, the second source/drain structures 174 are formed adjacent to the second gate structures 172 again, by techniques that are well known per se.

According to the present invention as described above, the first and second buried isolation patterns 146 and 150 offer a control on the body effect produced by the bias of the substrate 100. In particular, a buried isolation pattern spaces the substrate from the channel region of the recessed channel type of transistor so that the substrate bias may be easily controlled. The control of the substrate bias facilitates the control of the body effect so that the reliability of the recessed channel type of transistor can be enhanced.

Furthermore, the second buried isolation pattern 150 is disposed under both peripheral (end) portions of each longitudinally extending section of the second active pattern 136. Therefore, the second buried isolation pattern 150 effectively increases the path along which impurities of the second source/drain structures 174 could diffuse into the second source/drain structures 174 of neighboring transistors. That is, the provision of the second buried isolation pattern 150 prevents impurities of the second source/drain structures 174 from diffusing into the second source/drain structures 174 of neighboring transistors. This, in turn, allows this region of the semiconductor device to be highly integrated.

Finally, the foregoing description is illustrative of the present invention and is not to be construed as limiting thereof. That is, although the present invention has been described in connection with the preferred embodiments thereof, those skilled in the art will readily appreciate that the preferred embodiments can be modified without materially departing from the spirit of the invention. Accordingly, the present invention is not limited to the specific embodiments disclosed, but by the scope of the appended claims.

What is claimed is:

1. A semiconductor device comprising:
    a substrate;
    an active pattern on the substrate, the active pattern having adjacent sections, each of the sections extending longitudinally in a first direction;
    a field isolation pattern interposed between the adjacent sections of the active pattern;
    a buried isolation pattern on the substrate, the buried isolation pattern having a plurality of sections spaced apart from each other in the first direction under each of the sections of the active pattern, each of the sections of the buried isolation pattern extending from the field isolation pattern in a second direction perpendicular to the first direction;
    a gate structure comprising a gate of a transistor on the active pattern; and
    an impurity region adjacent to the gate structure at an upper surface of the active pattern, the impurity region and the buried isolation pattern being spaced from each other in a third direction perpendicular to the first and second directions.

2. The semiconductor device of claim 1, wherein the buried isolation pattern comprises a material substantially identical to that of the field isolation pattern.

3. The semiconductor device of claim 1, wherein one of the sections of the buried isolation pattern is disposed under a central portion of the active pattern.

4. The semiconductor device of claim 1, wherein the gate structure includes a gate insulation layer and a conductive pattern stacked on the gate insulation layer.

5. The semiconductor device of claim 4, wherein the active pattern has a recess in an upper surface thereof, the gate insulation layer extends along a surface of the active pattern delimiting the recess and along an upper surface of the active pattern around the recess, and the conductive pattern has a lower portion disposed in the recess and an upper portion protruding from the active pattern.

6. The semiconductor device of claim 5, wherein the upper surface of the buried isolation pattern is located at a level below that of the bottom of the conductive pattern of the gate structure.

7. A semiconductor device comprising:
a substrate having first and second regions;
an active pattern on the first region of the substrate and on the second region of the substrate, the active pattern on the first region of the substrate having adjacent sections, each of the sections extending longitudinally in a first direction, and each section of the active pattern on the first region of the substrate having at least one recess in the upper surface thereof;
a field isolation pattern interposed between the adjacent sections of the active pattern on the first region of the substrate;
a buried isolation pattern on the substrate, the buried isolation pattern having a plurality of sections spaced apart from each other in the first direction under each of the sections of the active pattern on the first region of the substrate, each of the sections of the buried isolation pattern extending from the field isolation pattern in a second direction perpendicular to the first direction;
a respective first gate structure occupying each said at least one recess in the active pattern on the first region of the substrate, whereby each said first gate structure comprises the gate of a recessed channel type of transistor;
at least one second gate structure disposed on the upper surface of the active pattern on the second region of the substrate, whereby each said second gate structure comprises the gate of a planar type of transistor; and
an impurity region adjacent to the gate structures at an upper surface of the active pattern on each of the first and second regions of the substrate, the impurity region and the sections of the buried isolation pattern on the first region of the substrate being spaced from each other in a third direction perpendicular to the first and second directions.

8. The semiconductor device of claim 7, wherein each of the sections of the active pattern on the first region of the substrate includes two recesses in the upper surface thereof, whereby two gates each of a recessed channel type of resistor occupy the recesses, respectively, and the sections of the buried isolation pattern under each of the sections of the active pattern on the first region of the substrate include a section between the gates and sections on opposite sides of the two gates in the first direction.

9. The semiconductor device of claim 8, wherein the active pattern on the second region of the substrate has adjacent sections each extending longitudinally in the first direction, the field isolation pattern has a second section interposed between the adjacent sections of the active pattern on the second region of the substrate, and the buried isolation pattern has a plurality of second sections spaced apart from each other in the first direction under each of the sections of the active pattern on the second region of the substrate, each of the second sections of the buried isolation pattern extending from the second section of the field isolation pattern in a second direction perpendicular to the first direction.

10. The semiconductor device of claim 7, wherein the active pattern on the second region of the substrate has adjacent sections each extending longitudinally in the first direction, the field isolation pattern has a second section interposed between the adjacent sections of the active pattern on the second region of the substrate, and the buried isolation pattern has a plurality of second sections spaced apart from each other in the first direction under each of the sections of the active pattern on the second region of the substrate, each of the second sections of the buried isolation pattern extending from the second section of the field isolation pattern in a second direction perpendicular to the first direction.

11. The semiconductor device of claim 7, wherein the buried isolation pattern comprises a material substantially identical to that of the field isolation pattern.

12. A method of manufacturing a semiconductor device, comprising:
forming an active pattern having adjacent sections each extending longitudinally in a first direction on a substrate;
forming a field isolation pattern between the adjacent sections of the active pattern;
forming a buried isolation pattern having sections spaced apart from each other in the first direction under each section of the active pattern, each of the sections of the buried isolation pattern extending from the field isolation pattern in a second direction perpendicular to the first direction;
forming a gate structure on the active pattern; and
forming an impurity region adjacent to the gate structure at a surface of the active pattern and as spaced from the buried isolation pattern in a third direction perpendicular to the first and second directions.

13. The method of claim 12, wherein the forming of the active pattern comprises:
forming a preliminary sacrificial pattern having sections each extending longitudinally in the second direction on the substrate, the preliminary sacrificial pattern comprising a material having an etch selectivity with respect to the substrate;
forming a silicon layer on the preliminary sacrificial pattern, the silicon layer having substantially the same etch selectivity with respect to the substrate as the preliminary sacrificial pattern;
etching the silicon layer and the preliminary sacrificial layer, to thereby form a preliminary active pattern having sections each extending longitudinally in the first direction, trenches delimiting the preliminary active pattern, and a sacrificial pattern interposed between the substrate and opposite peripheral portions in the first direction of each section of the preliminary active pattern; and
removing the sacrificial pattern so that a space is formed between the active pattern and the substrate.

14. The method of claim 13, wherein the process of etching the silicon layer and the preliminary sacrificial layer also comprises removing a portion of the substrate.

15. The method of claim 13, wherein the forming of the buried isolation pattern includes forming a preliminary sacrificial pattern having peripheral sections and a central section each extending longitudinally in the second direction and wherein the central section of the preliminary sacrificial pattern is intermediate the peripheral sections in the first direction, and the etching of the silicon layer and the preliminary sacrificial layer etches the central section of the preliminary sacrificial pattern to thereby form a central section of the sacrificial pattern under the central portion of each of the sections of the preliminary active pattern.

16. The method of claim 13, wherein the forming of the field isolation pattern and the buried isolation pattern comprise:
executing a first thermal oxidation process to form a first layer which extends along the active pattern including along sidewalls of the active pattern which define sides of the trenches;

forming a second layer on the first layer to a thickness sufficient to fill the space between the active pattern and the substrate, to fill the trenches, and to cover the active pattern; and subsequently performing a planarizing process that exposes the active pattern.

17. The method of claim 13, wherein the forming of the field isolation pattern and the buried isolation pattern comprise:

forming a first layer on the active pattern, including on sidewalls of the active pattern which define sides of the trenches, to a thickness sufficient to fill the space between the active pattern and the substrate;

forming a second layer on the first layer to a thickness sufficient to fill the trenches; and subsequently performing a planarizing process that exposes the active pattern.

18. The method of claim 12, wherein the forming of the gate structure includes:

sequentially forming a gate insulation layer and a conductive layer on the field isolation layer and the active pattern; and etching the conductive layer to form a conductive pattern.

19. The method of claim 12, wherein the forming of the gate structure includes:

etching the active pattern to form a recess in an upper surface thereof;

forming a gate insulation layer along an inner surface of the active pattern delimiting the recess and along upper surfaces of the active pattern and the field isolation pattern;

forming a conductive layer on the gate insulation layer to a thickness sufficient to fill the recess and cover the upper surface of the active pattern; and etching the conductive layer to form a conductive pattern protruding from the active pattern.

* * * * *